(12) United States Patent
Hashimoto

(10) Patent No.: US 7,075,381 B2
(45) Date of Patent: Jul. 11, 2006

(54) OSCILLATOR CIRCUIT AND OSCILLATOR

(75) Inventor: Hideo Hashimoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 41 days.

(21) Appl. No.: 10/824,578

(22) Filed: Apr. 14, 2004

(65) Prior Publication Data

US 2004/0263270 A1 Dec. 30, 2004

(30) Foreign Application Priority Data

Apr. 15, 2003 (JP) ............................. 2003-110258
Apr. 25, 2003 (JP) ............................. 2003-122671

(51) Int. Cl.
*H03B 5/32* (2006.01)
*H03B 5/30* (2006.01)
*H03B 5/36* (2006.01)
*H03B 5/12* (2006.01)
*H03L 1/00* (2006.01)

(52) U.S. Cl. .................. 331/158; 331/116 R; 331/175; 331/179

(58) Field of Classification Search ................ 331/158, 331/116 R, 161, 116 FE, 179, 174, 175, 185, 331/186

See application file for complete search history.

(56) References Cited

U.S. PATENT DOCUMENTS 5,136,263 A 8/1992 Lane
5,270,670 A 12/1993 Bladh (Continued)

FOREIGN PATENT DOCUMENTS

EP 0 794 611 9/1997

(Continued)

OTHER PUBLICATIONS

European Search Reort dated Jan. 27, 2005.

(Continued)

*Primary Examiner*—Robert Pascal
*Assistant Examiner*—James Goodley
(74) *Attorney, Agent, or Firm*—Scott D. Wofsy; Edwards Angell Palmer & Dodge LLP

(57) ABSTRACT

The present invention relates to a crystal oscillator circuit in which the output level is maintained to prevent changes in oscillation frequency due to variations in power voltage. This crystal oscillator circuit comprises a resonance circuit formed of a crystal oscillator (which acts as an inductor component) and dividing capacitors, an oscillation amplifier formed of ECL circuitry driven by a power voltage connected to the resonance circuit, and a pull-down resistor between an output terminal of the ECL circuit and ground. The pull-down resistor acts as serially-connected dividing resistors and also a bias capacitor is provided between a connection point between those dividing resistors and ground. The present invention also relates to a frequency-switching oscillator having a simple circuit design and a small number of components. This frequency-switching oscillator enables a configuration in which an oscillation amplifier that is a two input, two output type of ECL circuit having mutually inverted signals is connected to a resonance circuit formed of a crystal oscillator and dividing capacitors; a first resonance circuit provided with a first electronic switch is connected between one pair of input-output terminals for mutually inverted signals of the ECL circuit; a second resonance circuit is connected between another pair of input-output terminals for mutually inverted signals of the ECL circuit; and the resonance frequencies of the first and second resonance circuits are different and also the first and second electronic switches are switched to select one of the resonance circuits.

14 Claims, 7 Drawing Sheets

U.S. PATENT DOCUMENTS

| | | | | |
|---|---|---|---|---|
| 5,627,498 A | * | 5/1997 | Meyer | 331/117 R |
| 5,646,580 A | * | 7/1997 | Perkins | 331/116 R |
| 6,172,574 B1 | * | 1/2001 | Sirito-Olivier | 331/116 R |
| 6,433,309 B1 | | 8/2002 | Hashimoto et al. | 219/210 |
| 6,559,730 B1 | * | 5/2003 | Marvin et al. | 331/158 |
| 6,933,794 B1 | * | 8/2005 | Ogiso | 331/117 R |
| 2001/0006357 A1 | * | 7/2001 | Yamamoto | 331/75 |

FOREIGN PATENT DOCUMENTS

JP     2002-359521     12/2002

OTHER PUBLICATIONS

"Crystals Made Clear II," Electronics World, Oct. 1999.

* cited by examiner

OSCILLATOR CIRCUIT AND OSCILLATOR

BACKGROUND OF THE INVENTION

The present invention relates to an oscillator circuit for high frequencies and, in particular, to a crystal oscillator circuit in which changes in the oscillation frequency due to variations in the power voltage are prevented.

Crystal oscillator circuits usually have highly stable frequencies, so they are applied as frequency sources in different types of electronic appliances. There have recently been requests for a crystal oscillator circuit with a high oscillation frequency, for building optical communications systems. One of these utilizes an emitter coupled logic (ECL) circuit that operates at high speed, as an oscillation amplifier. A conventional type of crystal oscillator circuit is shown in FIGS. 7 to 9, with FIG. 7 showing the crystal oscillator circuit, FIG. 8 showing the internal ECL circuitry, and FIG. 9 showing a simplified oscillator circuit.

This conventional oscillator circuit is configured of a resonance circuit 1 and an oscillation amplifier 5a, as shown within the dotted line in FIG. 7. The resonance circuit 1 is formed of a crystal oscillator 3 made of quartz crystal and dividing capacitors 4a and 4b, where the crystal oscillator 3 is of AT cut or the like and functions as an inductor component. The dividing capacitors 4a and 4b are connected to the two ends of the crystal oscillator 3 and each is connected to ground.

The oscillation amplifier 5a has the abovementioned ECL structure, where the ECL circuit integrates a differential amplifier having two inputs A and B and two outputs C and D, of mutually opposite phases. As shown by way of example in FIG. 8, in which the interior of the ECL circuit is bounded by broken lines, the emitters of a first transistor Tr1 and a second transistor Tr2 are connected in common to ground. The collectors of the two transistors Tr1 and Tr2 are connected to a power source Vcc and the bases thereof are connected to the input terminals A and B, to which signals of opposite phases are input.

The oscillation amplifier 5a also has the output terminals C and D which obtain signals of opposite phases from the emitters of a third transistor Tr3 and a fourth transistor Tr4 that are connected to the first transistor Tr1 and the second transistor Tr2. Ordinarily, pull-down resistors 9a and 9b are connected externally to the output terminals C and D, respectively, as loads. These resistors have large resistances on the order of 150 to 200 Ω, for example, to prevent overheating due to excessive DC currents and to stabilize the operation.

In addition, the two ends of the crystal oscillator 3 are connected between the input B and output C, of mutually opposite phase, of the ECL for oscillation, as shown in FIG. 7. A bias resistor 7 and a bias capacitor 8 are connected on the ECL input side and a buffer amplifier 5b using ECL circuitry similar to that for oscillation is connected the output side thereof. Each of the oscillation amplifier 5a and the buffer amplifier 5b is driven by a voltage supplied from the power source Vcc. Note that if the oscillation portions only of the oscillation oscillator amplifier 5a are drawn simplified, the result would be as shown in FIG. 9 where it is clear that only the pull-down resistor 9a provided between one input B and output C has an effect on the oscillation-related components.

With the conventional crystal oscillator circuit, the oscillation amplifier (ECL) 2 works to feed back and amplify the resonance frequency of the resonance circuit 1 that is connected between one pair of input B and output C, to maintain the oscillation of a rectangular waveform. Note that the configuration is such that the other input A and output D achieve an input and output that are of opposite phase to the input B and the output C, due to the differential amplifier structure. Load is applied to the pull-down resistors 9a and 9b shown in FIG. 7 and the two outputs of opposite phase are amplified by the buffer amplifier 5b, to obtain two values of oscillation output. The oscillation frequencies in this case substantially match the resonance frequencies, but from the viewpoint of the crystal oscillator 3 they are determined by the load capacitances on the circuit side.

However, this conventional crystal oscillator circuit has a problem in that the oscillation frequency changes with variations in the power voltage Vcc. In other words, since an active element (in this case, the ECL circuit acting as the oscillation amplifier 5a of FIG. 7) has a characteristic that varies with the power voltage, the oscillation frequency also changes. In this case, the oscillation frequency varies upward as the power voltage Vcc rises, in other words, it varies upward as the current in the crystal oscillator 3 increases, so that the slope changes in accordance with the characteristic of the crystal oscillator 3 (see FIG. 7).

For that reason, a stabilizing circuit is usually inserted between the power source and the oscillator circuit, to stabilize the power voltage Vcc as shown, for example, in FIG. 11. However, the stabilizing circuit in such a case causes losses in the power voltage Vcc. Thus, a problem arises in that the output level drops, particularly when the circuit is driven at a low voltage such as below 3.3 V.

When ECL circuitry is used as the oscillation amplifier 5a, as shown in FIG. 7, the pull-down resistor 9a is attached externally and is connected to the output terminal C, as described previously. For that reason, it is considered to reduce the value of the pull-down resistor 9a so that the current to the crystal oscillator 3 is also reduced. However, excessive DC current in the pull-down resistor 9a could lead to overheating in this case, so it is not possible to make the value of the pull-down resistor 9a small in this manner. Note that since the ECL that is usually used is a generic circuit, the pull-down resistors 9a and 9b are attached externally to set the resistance as required.

In addition, frequency changes due to variations in the power voltage Vcc increase as the oscillation frequency increases. This is because of the thickness of the crystal oscillator 3 (quartz crystal fragment) decreases as the vibration frequency thereof increases in correspondence with the oscillation frequency, and it becomes sensitive to the drive level (electrical field) based on the power voltage Vcc. For that reason, changes in the oscillation frequency due to variations in the power voltage Vcc become a problem when the oscillation frequency is of the 600 MHz band.

The present invention also relates to a frequency-switching oscillator, in particular to a frequency-switching crystal oscillator (hereinafter called a "frequency-switching oscillator") having a simple circuit design and a small number of components.

A circuit diagram that illustrates a prior-art example of this type of frequency-switching oscillator is shown in FIG. 12.

As shown in FIG. 12, the conventional frequency-switching oscillator comprises a plurality of (such as two) crystal oscillators 41a and 41b that operate as inductor components, dividing capacitors 42a and 42b that form a resonance circuit 47 therewith, and an oscillation amplifier (transistor for oscillation) 43 that amplifies and feeds back the resonance frequency of that resonance circuit 47. The oscillation transistor 43 grounds the emitter side through a load resistor

44, by way of example. Note that in this case, the oscillation frequency is roughly dependent on the resonance frequency of the resonance circuit 47, but strictly speaking it is determined by serial equivalent capacitances on the circuit side as seen from the crystal oscillators 41*a* and 41*b*.

Ordinarily, the base of the oscillation transistor 43 is connected to the connection point between the crystal oscillators 41*a* and 41*b* and the dividing capacitors 42*a* and 42*b*, the emitter of the transistor 43 is connected to the centerpoint of the dividing capacitors 42*a* and 42*b*, and the collector of the transistor 43 is connected to the power voltage Vcc, as shown in FIG. 12, so that an output Vout is obtained from the emitter, by way of example. In addition, a bias voltage is supplied to the base of the oscillation transistor 43 by dividing bias resistors 45*a* and 45*b*. An electronic switch 46 switches between the crystal oscillators 41*a* and 41*b*, for the 100 MHz band and the 600 MHz band, by way of example, to select the desired frequency. In this case, the electronic switch 46 is configured of a semiconductor switching element that is designed to select on or off in accordance with a 1 or 0 signal from the exterior, by way of example. (See FIG. 3 of Japanese Laid-Open Patent Publication No. 2002-359521, for example.)

However, with this conventional frequency-switching oscillator, the crystal oscillators 41*a* and 41*b* switch between two frequencies. For that reason, the crystal oscillators 41*a* and 41*b* and also the dividing capacitors 42*a* and 42*b* that form the resonance circuit 47 are required to have capacitances within ranges that satisfy one of these oscillation conditions. This causes further problems in that it is necessary to provide another oscillation amplifier and also the resonance circuit 47, increasing the number of components.

SUMMARY OF THE INVENTION

The present invention was made in the light of the problems involved with this conventional oscillator circuit, with the objective of providing a crystal oscillator circuit in which output levels are maintained, in particular, and also changes in oscillation frequency due to variations in power voltage are prevented.

The present invention relates to crystal oscillator circuit comprising a resonance circuit formed of a crystal oscillator as an inductor component and dividing capacitors, an oscillation amplifier formed of an ECL circuit driven by a power voltage connected to the resonance circuit, and a pull-down resistor provided between an output terminal of the ECL circuit and ground; wherein the pull-down resistor acts as serially connected dividing resistors and also a by-pass capacitor is provided between a connection point between the dividing resistors and ground.

Since this configuration makes it possible to increase the resistance by the first and second dividing resistors, the DC current can be controlled to be small, and the operation of the ECL circuit can be stabilized by suppressing heating due to overcurrents.

Furthermore, since the AC resistance is reduced by the provision of the bias capacitor between the connection point of the dividing resistors and ground, high-frequency currents to the crystal oscillator can be controlled to be small with respect to variations in the power voltage, making it possible to prevent frequency variations due to changes in the current of the crystal oscillator. The conventional stabilizing circuit is not used, making it possible to maintain the output level without generating any loss in the power voltage.

The present invention also relates to a frequency-switching transmitter oscillator, in particular to a frequency-switching oscillator having a simple circuit design and a small number of components.

This aspect of the present invention has a configuration such that a first resonance circuit formed of a crystal oscillator and dividing capacitors and provided with a first electronic switch is connected between one pair of input-output terminals for mutually inverted signals of an ECL circuit, which acts as a two input, two output type of oscillation amplifier; a second resonance circuit formed of a crystal oscillator and dividing capacitors and provided with a second electronic switch is connected between another pair of input-output terminals for mutually inverted signals of the ECL circuit; and the resonance frequencies of the first and second resonance circuits are different and also the first and second electronic switches are switched to select one of the resonance circuits.

Since the frequency-switching oscillator of the present invention therefore has the first and second resonance circuits, the capacitances of the dividing capacitors can be determined for each resonance circuit and the capacitances of the dividing capacitors can be set to optimal values. An ECL circuit having two inputs and two outputs is employed as the oscillation amplifier, so the oscillation amplifier can be configured by a single component.

DETAILED DESCRIPTION OF THE EMBODIMENTS

First Embodiment

Figure 1:
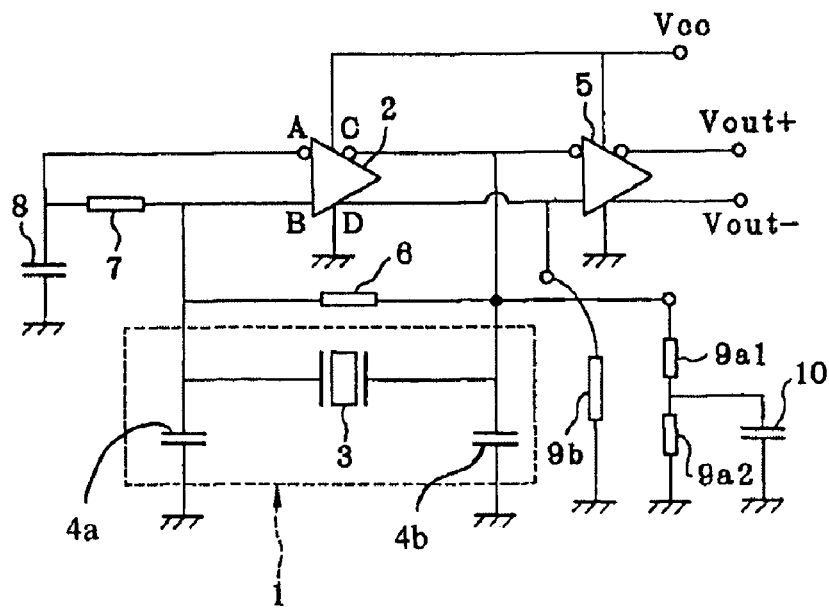
FIG. 1 is a circuit diagram of an embodiment of the crystal oscillator circuit in accordance with the present invention.
Figure 2:
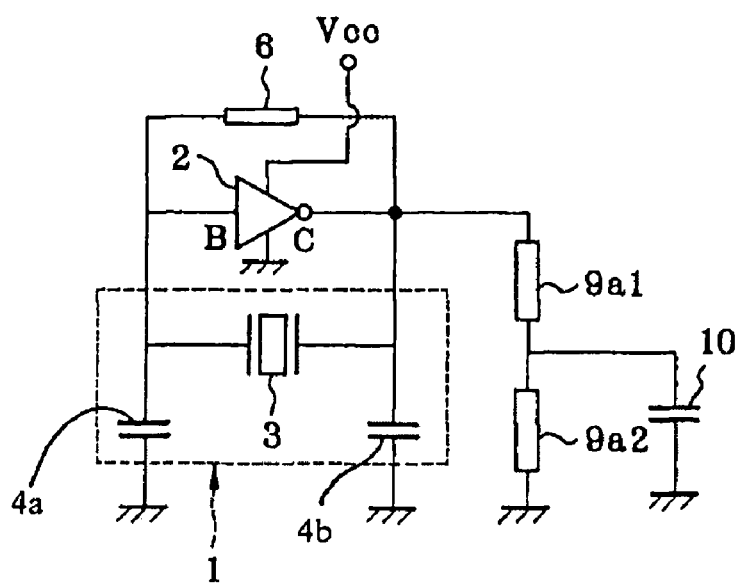
FIG. 2 is a circuit diagram of a simplified oscillator circuit applied to the first embodiment of the crystal oscillator circuit in accordance with the present invention.
Figure 3:
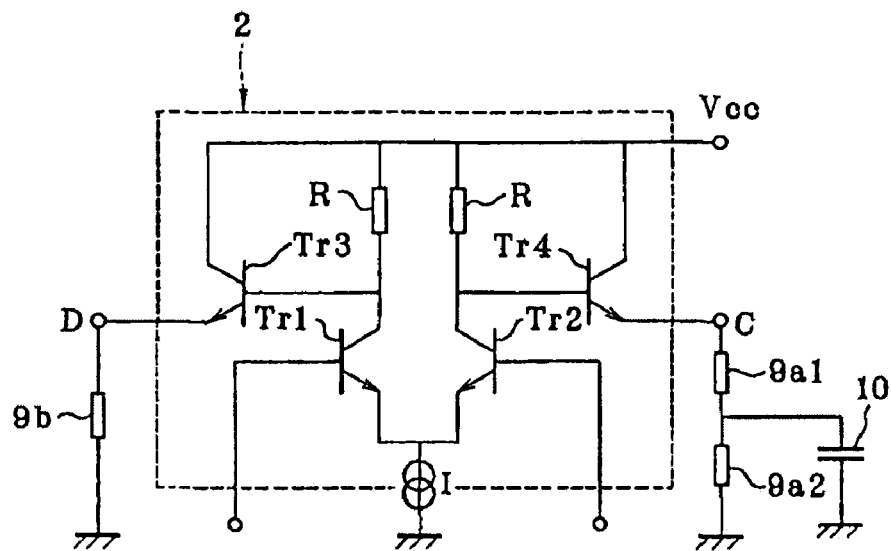
FIG. 3 is an internal circuit diagram of ECL circuitry applied to the first embodiment of the crystal oscillator circuit in accordance with the present invention.

A first embodiment of a crystal oscillator circuit in accordance with the present invention is shown in FIGS. 1 to 3 with FIG. 1 showing the crystal oscillator circuit, FIG. 2 showing a simplified oscillator circuit, and FIG. 3 showing an internal circuit diagram of the ECL circuitry.

The crystal oscillator circuit of the present invention is configured of a resonance circuit 1 and an oscillation amplifier 2, as shown within the dotted line in FIG. 1. The resonance circuit 1 is formed of a crystal oscillator 3 and dividing capacitors 4a and 4b, where the crystal oscillator 3 is of AT cut or the like and functions as an inductor component. The dividing capacitors 4a and 4b are connected to the two ends of the crystal oscillator 3 and each is connected to ground.

The oscillation amplifier 2 has the abovementioned emitter coupled logic (ECL) structure, where the ECL circuit integrates a differential amplifier having two inputs A and B and two outputs C and D, of mutually opposite phases. As shown by way of example in FIG. 3, in which the interior of the ECL circuit is bounded by broken lines, the emitters of a first transistor Tr1 and a second transistor Tr2 are connected in common to ground. The collectors of the two transistors Tr1 and Tr2 are connected to a power source Vcc and the bases thereof are connected to the input terminals A and B, to which signals of opposite phases are input.

The oscillation amplifier 2 also has the output terminals C and D which obtain signals of opposite phases from the emitters of a third transistor Tr3 and a fourth transistor Tr4 that are connected to the first transistor Tr1 and the second transistor Tr2.

In addition, the two ends of the crystal oscillator 3 are connected between the input B and output C, of mutually opposite phase, of the ECL for oscillation, as shown in FIG. 1. A bias resistor 7 and a bias capacitor 8 are connected on the ECL input side and a buffer amplifier 5 using ECL circuitry similar to that for oscillation is connected the output side thereof. Each of the oscillation amplifier 2 and the buffer amplifier 5 is driven by a voltage supplied from the power source Vcc. Note that if the oscillation portions only of the oscillation oscillator amplifier 2 are drawn simplified, the result would be as shown in FIG. 2.

Pull-down resistors are connected to the output terminals C and D to apply loads thereto. These pull-down resistors are a first dividing resistor 9a1 on the circuit side and a second dividing resistor 9a2 on the ground side, connected in series as shown in FIGS. 1 and 2. A grounded by-pass capacitor 10 is connected to the connection point of these dividing resistors 9a1 and 9a2. The resistances of the dividing resistors 9a1 and 9a2 are such that: 9a1<9a2. Assume that the dividing resistor 9a1 is 10 Ω and the dividing resistor 9a2 is 150Ω.

Since the pull-down resistors in this case are the dividing resistors 9a1 and 9a2 connected in series, the DC current can be made small by increasing the total resistance thereof (to 160Ω), in a similar manner to the conventional art. Heating is therefore suppressed and the operation of the ECL is stabilized. Note that in this case, reference characters 6 and 9b denote a feed back resistor and a pull down resistor, respectively.

Since the by-pass capacitor 10 is connected to the connection point of the dividing resistors 9a1 and 9a2, the AC resistance can be greatly reduced to approximately 10.OMEGA. The high-frequency current (oscillation current) flowing in the crystal oscillator 3 that is parallel to the pull-down resistors 9a1 and 9a2 can therefore be controlled. This makes it possible to prevent frequency variations to the utmost, because the variations in the high-frequency current flowing in the crystal oscillator 3 are small even if there are variations in the power voltage Vcc.

Note that the reduction in high-frequency current flowing through the crystal oscillator 3 could be achieved by connecting a resistor in series with the crystal oscillator 3, but in this case the resistance component within the resonance circuit 1 would increase. The startup characteristic at power-on will therefore deteriorate, particularly when the drive levels are low, but the pull-down resistors disposed outside the resonance circuit 1 of the crystal oscillator circuit of the present invention are large, making it possible to maintain the startup characteristic in a favorable manner.

Second Embodiment

Figure 4:
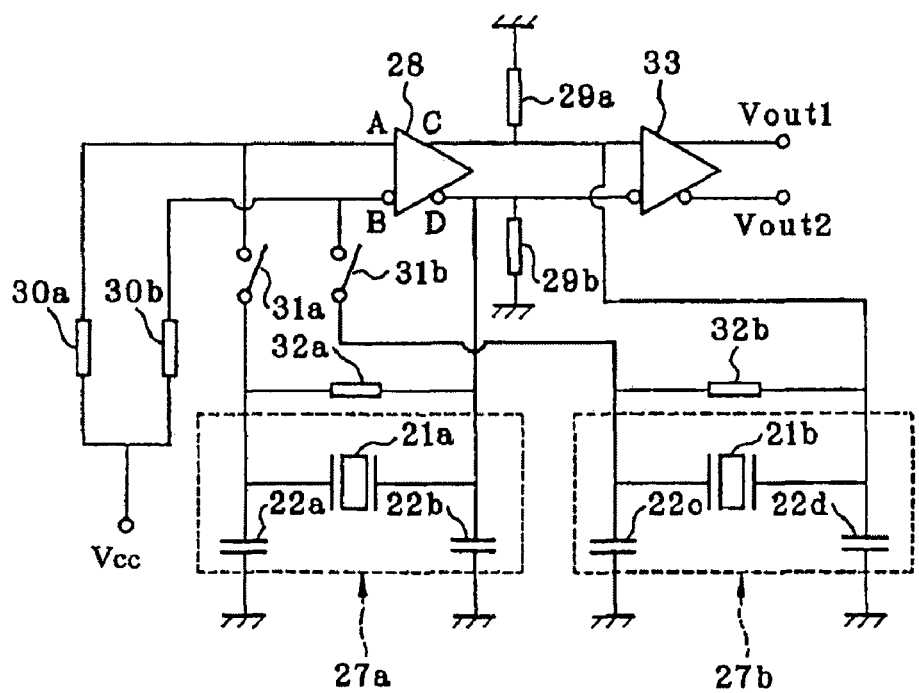
FIG. 4 is a circuit diagram of an embodiment of a frequency-switching oscillator in accordance with the present invention.

A circuit diagram that illustrates an embodiment of the frequency-switching oscillator in accordance with the present invention is shown in FIG. 4.

The frequency-switching oscillator of this invention is configured of an oscillation amplifier 28 of ECL structure (formed of an oscillation ECL circuit) that has a first resonance circuit 27a comprising a quartz crystal oscillator 21a and dividing capacitors 22a and 22b, and a second resonance circuit 27b comprising a crystal oscillator 21b and dividing capacitors 22c and 22d. The oscillation ECL circuit 28 incorporates a differential amplifier and has two input terminals A and B and two output terminals C and D, of mutually opposite phases.

Figure 5:
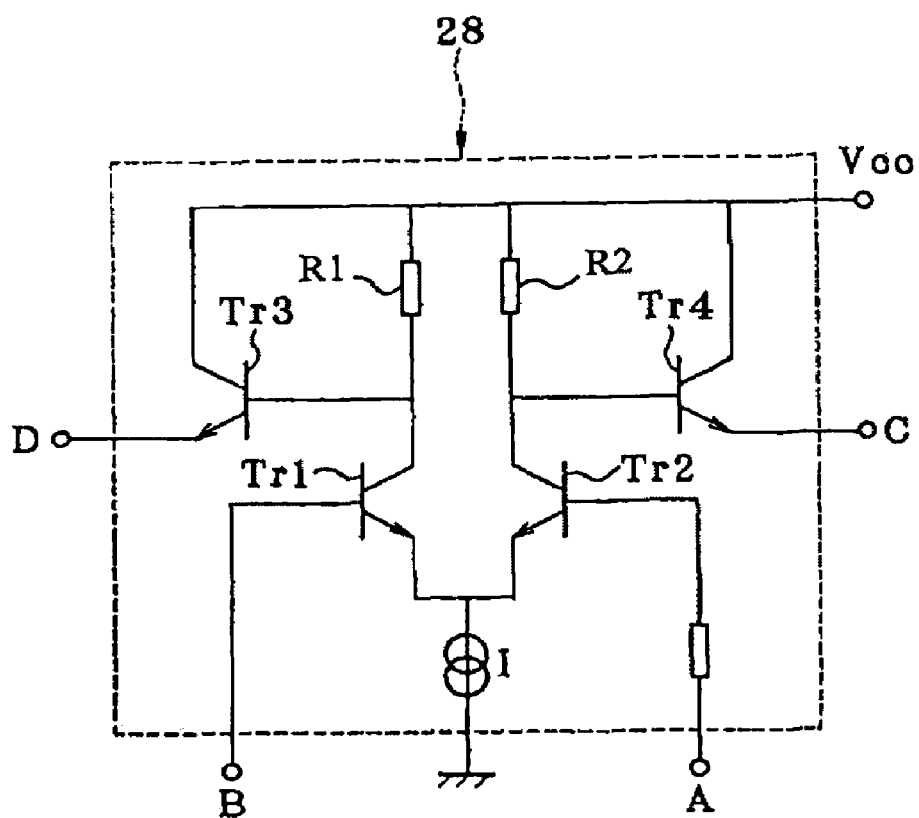
FIG. 5 is an internal circuit diagram of ECL circuitry applied to the embodiment of the frequency-switching oscillator in accordance with the present invention.

With the frequency-switching oscillator of the present invention, the emitters of a first transistor Tr1 and a second transistor Tr2 are connected in common and are grounded through a constant-current source I, as shown in FIG. 5. The configuration is such that the collectors of the transistors Tr1 and Tr2 are connected to the power source Vcc and the input terminals A and B are provided for applying signals of opposite phases to the bases of those transistors. In addition, there are the output terminals C and D Which obtain signals of opposite phases from the emitters of the third transistor Tr3 and the fourth transistor Tr4 that are connected to the first transistor Tr1 and the second transistor Tr2. Note that in this case, a reference characters R1 and R2 denotes bias resistors.

Pull-down resistors 29a and 29b that act as loads are connected externally to the output terminals C and D, respectively, of the oscillation amplifier 28, as shown in FIG. 4.

Bias resistors 30a and 30b are connected to the terminals A and B of the scillation amplifier 28, and also to a power source Vcc. Note that these bias resistors 30a and 30b set the bias voltages at the bases of Tr1 and Tr2, in accordance with the dividing resistor ratio with the resistors R1 and R2 within the oscillation ECL.

In addition, the first resonance circuit 27a is connected to one pair of input-output terminals A and D of mutually opposite phase of the oscillation ECL 28 by a first electronic switch 31a to form an oscillator circuit of the 150-MHz band, as shown in FIG. 4 by way of example. Similarly, the second resonance circuit 27b is connected to the other pair of input-output terminals B and C of mutually opposite phase of the oscillation ECL 28 by second electronic switches 31a and 31b, to form an oscillator circuit of the 600-MHz band. In this case, one of the first and second electronic switches 31a and 31b is turned on and the other is turned off by signals from the exterior. Note that reference characters 32a and 32b denote feedback resistors and 33 denotes an ECL circuit acting as a buffer amplifier.

Since the above-described configuration is provided with first and second resonance circuits 27a and 27b in the oscillator circuits, the capacitances of the dividing capacitors 22a, 22b, 22c, and 22d can be set to the optimal values, simplifying the circuit design. Since a two input, two output type of ECL is employed as an oscillation amplifier, a single oscillation amplifier can be used to configure two crystal oscillator circuits.

Figure 6:
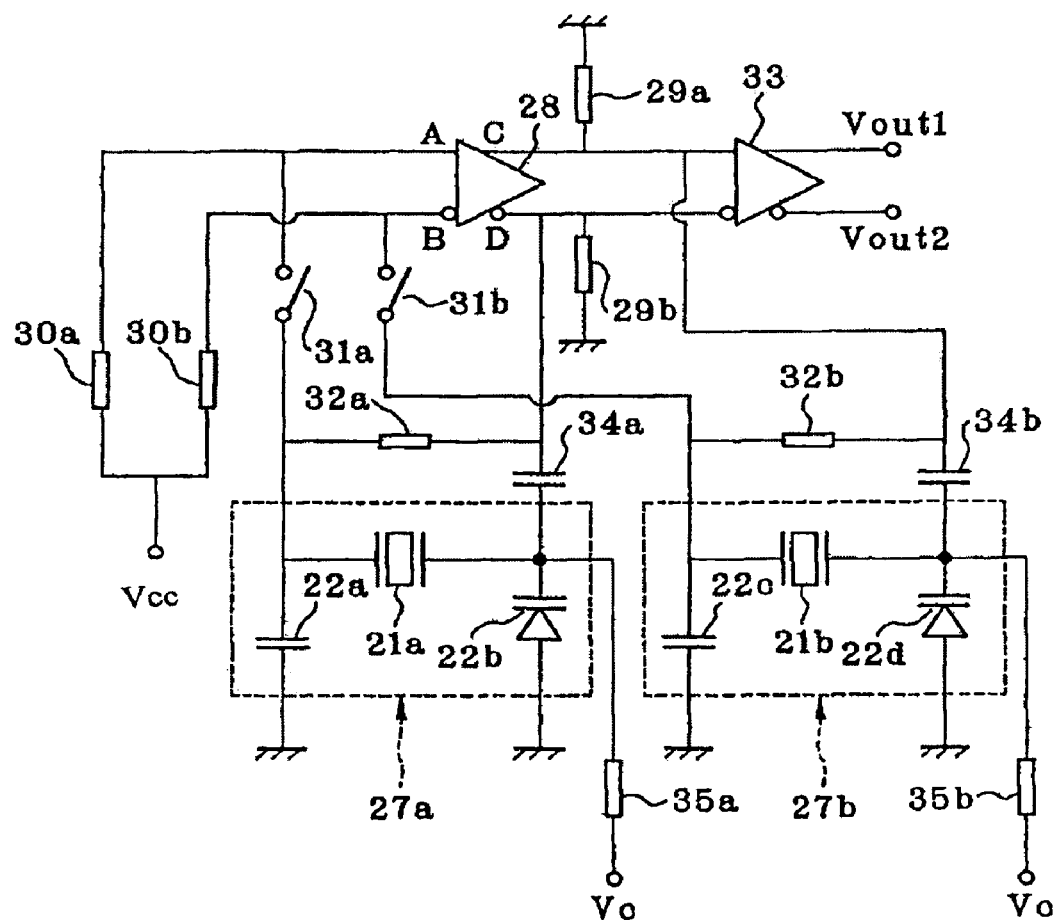
FIG. 6 is a circuit diagram of another embodiment of the frequency-switching oscillator in accordance with the present invention.
Figure 7:
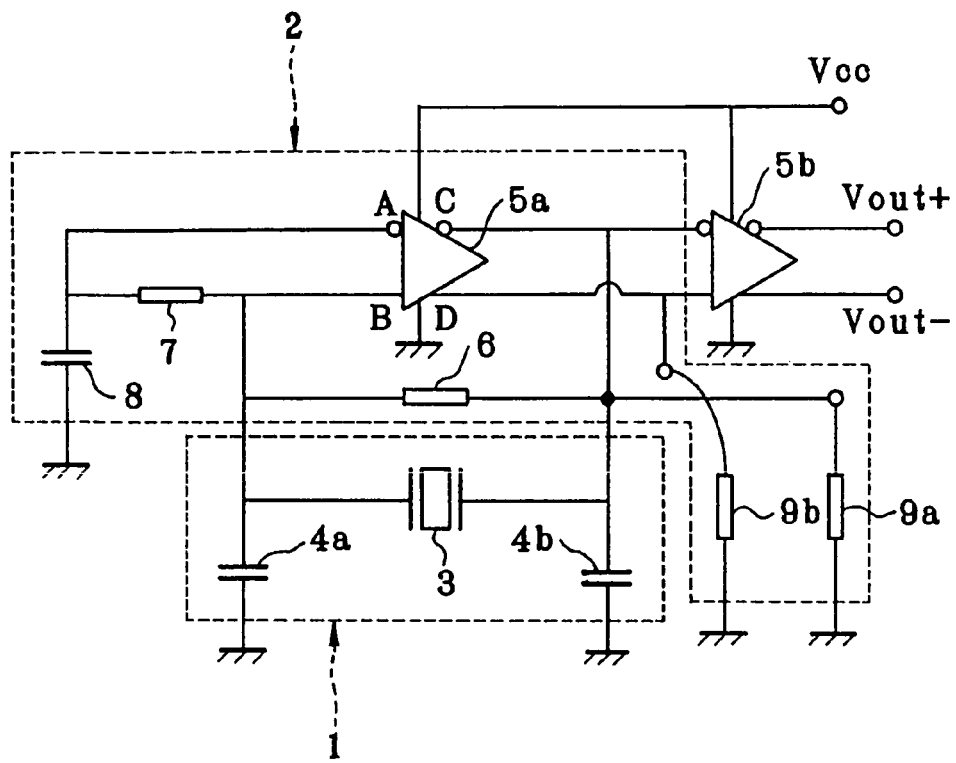
FIG. 7 is a circuit diagram of a conventional crystal oscillator circuit.
Figure 8:
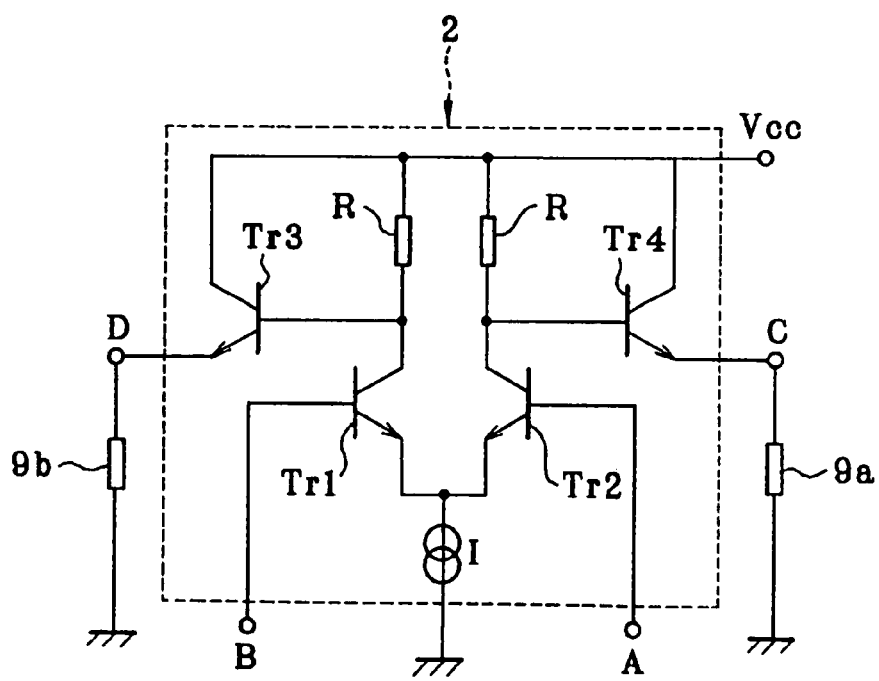
FIG. 8 is an internal circuit diagram of ECL circuitry used in the conventional crystal oscillator circuit.
Figure 9:
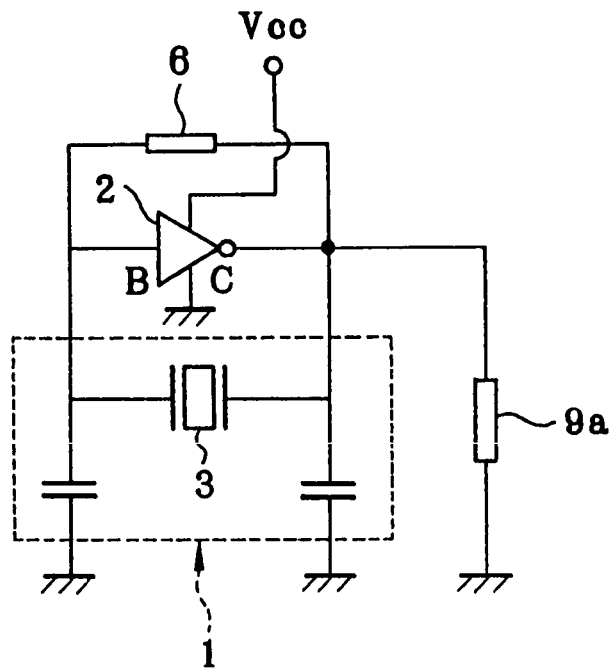
FIG. 9 is a circuit diagram of a simplified oscillator circuit illustrating the conventional crystal oscillator circuit.
Figure 10:
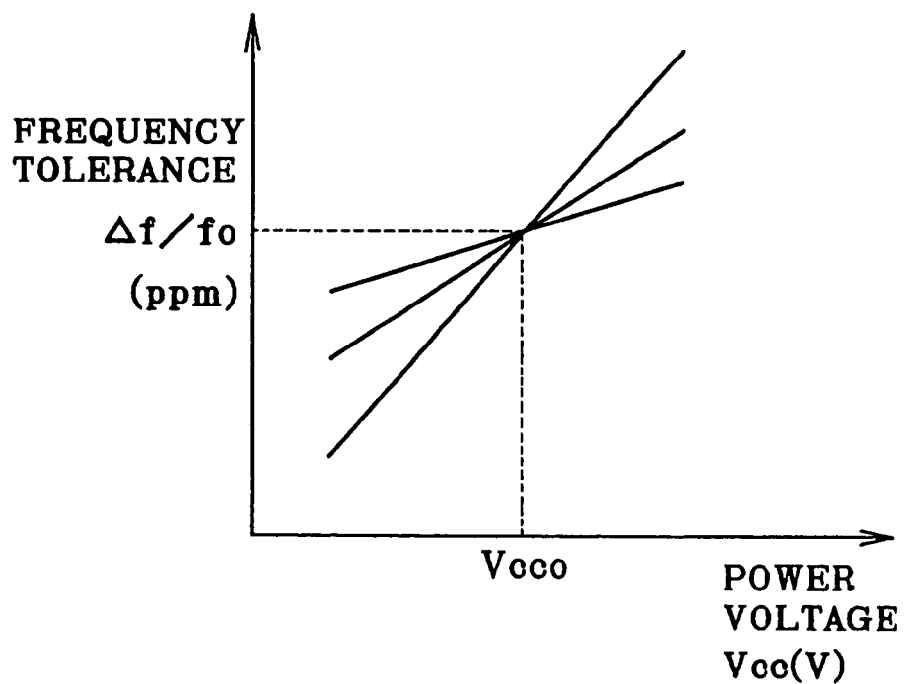
FIG. 10 is a graph of the characteristic of frequency tolerance with respect to power voltage in the conventional crystal oscillator circuit.
Figure 11:
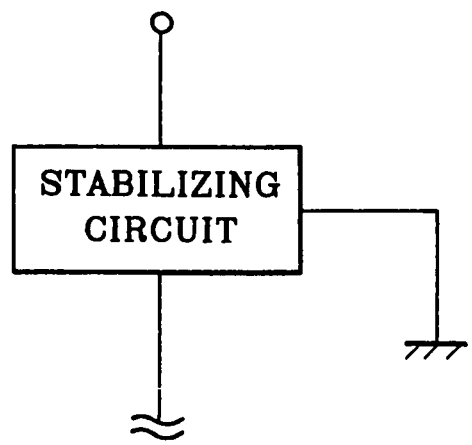
FIG. 11 is a partial circuit diagram of a crystal oscillator circuit that prevents any change in oscillation frequency due to variations in the power voltage of the conventional crystal oscillator circuit.
Figure 12:
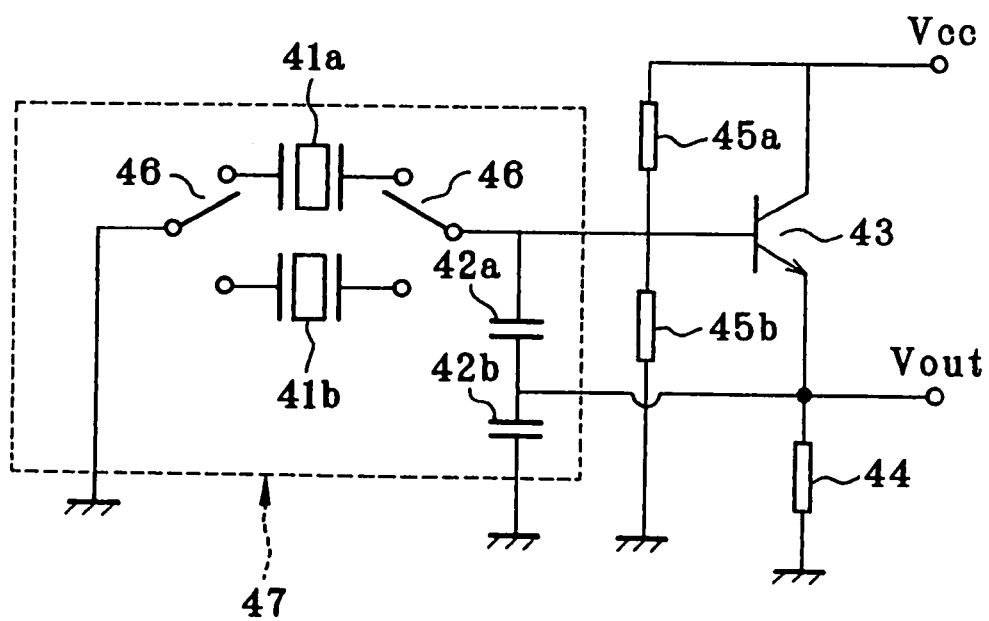
FIG. 12 is a circuit diagram of a conventional frequency-switching oscillator.

The description of the embodiment above related to an ordinary crystal oscillator circuit, but a voltage controlled oscillator could also be used therefor, as shown by way of example in FIG. 6. In other words, in this embodiment (see FIG. 6), the dividing capacitors 22b and 22d of FIG. 1 could be used as variable-voltage capacitance elements to apply a control voltage Vc and thus vary the oscillation frequencies. Note that in this case, reference characters 34a and 34b denote capacitors that are DC components and 35a and 35b denote high-frequency prevention resistors. Furthermore, the present invention was described above as involving crystal oscillators, but one or both of them could be replaced by other piezoelectric elements such as ceramic resonators.

With the frequency-switching oscillator of the present invention, a first resonance circuit formed of a crystal oscillator and dividing capacitors and provided with a first electronic switch is connected between one pair of input-output terminals for mutually inverted signals of the ECL circuit, which acts as a two input, two output type of oscillation amplifier; a second resonance circuit formed of a crystal oscillator and dividing capacitors and provided with a second electronic switch is connected between another pair of input-output terminals for mutually inverted signals of the ECL circuit; and the resonance frequencies of the first and second resonance circuits are different and also the first and second electronic switches are switched to select one of the resonance circuits. This makes it possible to provide a frequency-switching oscillator of a simple design and with a small number of components.

What is claimed is:

1. An oscillator circuit comprising:
a resonance circuit formed of a resonator as an inductor component and dividing capacitors, each dividing capacitors having a first end connected to the resonator and a second end connected to ground, an oscillation amplifier driven by a power voltage connected to said resonance circuit, and a pull-down resistor provided between an output terminal of said oscillation amplifier and ground, wherein said pull-down resistor is serially-connected dividing resistors, the serially-connected dividing resistors being a first pull-down resistor connected circuit side and a second pull-down resistor connected ground side, and a by-pass capacitor is directly connected between a connection point between said dividing resistors and ground, wherein a resistance of the first pull-down resistor is less than a resistance of the second pull-down resistor.

2. The oscillator circuit according to claim 1, wherein said oscillation amplifier is configured of an emitter coupled logic (ECL) circuit.

3. The oscillator circuit according to claim 1, wherein said oscillator is a crystal oscillator in which a crystal is used in the resonator thereof.

4. The oscillator circuit according to claim 1, wherein said oscillator is a crystal oscillator in which a quartz crystal is used in the resonator thereof.

5. The oscillator circuit according to claim 1, wherein said oscillator is a ceramic oscillator in which a ceramic is used in the resonator thereof.

6. The oscillator circuit according to claim 1, wherein the oscillation amplifier includes a differential amplifier having two inputs and two outputs of mutually opposite phases.

7. The oscillator circuit according to claim 1, further comprising a resistor connected in series with the inductor component for reducing high-frequency current flowing therethrough.

8. An oscillator circuit comprising:
a resonance circuit formed of a resonator as an inductor component and dividing capacitors, each dividing capacitors having a first end connected to the resonator and a second end connected to ground, an oscillation amplifier driven by a power voltage connected to said resonance circuit, and a pull-down resistor provided between an output terminal of said oscillation amplifier and ground, wherein said pull-down resistor is serially-connected dividing resistors, the serially-connected dividing resistors being a first pull-down resistor connected circuit side and a second pull-down resistor connected ground side, and a by-pass capacitor is directly connected between a connection point between said dividing resistors and ground, wherein the resistance of the first pull-down resistor is 10Ω and the resistance of the second pull-down resistor is 150Ω.

9. The oscillator circuit according to claim 8, wherein said oscillation amplifier is configured of an emitter coupled logic (ECL) circuit.

10. The oscillator circuit according to claim 8, wherein said oscillator is a crystal oscillator in which a crystal is used in the resonator thereof.

11. The oscillator circuit according to claim 8, wherein said oscillator is a crystal oscillator in which a quartz crystal is used in the resonator thereof.

12. The oscillator circuit according to claim 8, wherein said oscillator is a ceramic oscillator in which a ceramic is used in the resonator thereof.

13. The oscillator circuit according to claim 8, further comprising a resistor connected in series with the inductor component for reducing high-frequency current flowing therethrough.

14. The oscillator circuit according to claim 8, wherein the oscillation amplifier includes a differential amplifier having two inputs and two outputs of mutually opposite phases.

* * * * *